United States Patent
Tsukamoto

(10) Patent No.: US 10,840,901 B2
(45) Date of Patent: Nov. 17, 2020

(54) SEMICONDUCTOR DEVICE AND CONTROL DEVICE

(71) Applicants: AutoNetworks Technologies, Ltd., Mie (JP); Sumitomo Wiring Systems, Ltd., Mie (JP); SUMITOMO ELECTRIC INDUSTRIES, LTD., Osaka (JP)

(72) Inventor: Katsuma Tsukamoto, Mie (JP)

(73) Assignees: AutoNetworks Technologies, Ltd., Mie (JP); Sumitomo Wiring Systems, Ltd., Mie (JP); Sumitomo Electric Industries, Ltd., Osaka (JP)

(*) Notice: Subject to any disclaimer, the term of this patent is extended or adjusted under 35 U.S.C. 154(b) by 338 days.

(21) Appl. No.: 15/763,174

(22) PCT Filed: Sep. 15, 2016

(86) PCT No.: PCT/JP2016/077208
§ 371 (c)(1),
(2) Date: Mar. 26, 2018

(87) PCT Pub. No.: WO2017/057011
PCT Pub. Date: Apr. 6, 2017

(65) Prior Publication Data
US 2018/0309434 A1    Oct. 25, 2018

(30) Foreign Application Priority Data
Sep. 29, 2015 (JP) .................. 2015-192122

(51) Int. Cl.
*H03K 17/082* (2006.01)
*H03K 17/08* (2006.01)
(Continued)

(52) U.S. Cl.
CPC ......... *H03K 17/0822* (2013.01); *H02H 3/085* (2013.01); *H03K 17/08* (2013.01);
(Continued)

(58) Field of Classification Search
CPC .. H03K 17/0822; H03K 17/08; H03K 17/145; H03K 17/161; H03K 17/687;
(Continued)

(56) References Cited

U.S. PATENT DOCUMENTS

| | | | | |
|---|---|---|---|---|
| 6,061,221 A | * | 5/2000 | Tihanyi | H03K 17/0822 307/117 |
| 6,205,010 B1 | * | 3/2001 | Ohsaka | H03K 17/0822 361/103 |
| 6,222,346 B1 | | 4/2001 | Mori | |
| 6,335,577 B1 | * | 1/2002 | Baba | H02H 3/087 307/28 |
| 7,835,129 B2 | * | 11/2010 | Thiele | H03K 17/6877 361/103 |
| 2004/0070910 A1 | * | 4/2004 | Gergintschew | H03K 17/0822 361/103 |

(Continued)

OTHER PUBLICATIONS

Search Report for PCT/JP2016/077208, dated Nov. 29, 2016.

*Primary Examiner* — Dharti H Patel
(74) *Attorney, Agent, or Firm* — Honigman LLP

(57) ABSTRACT

The present invention provides a semiconductor device in which a field effect transistor is prevented from burning caused by an electric current flowing through a parasitic diode. This semiconductor device has a configuration including: a field effect transistor including a parasitic diode; a temperature detector that detects a temperature of the parasitic diode; and a controller that determines whether the temperature detected by the temperature detector is higher than or equal to a first temperature, and turns on the field effect transistor if the detected temperature is higher than or equal to the first temperature.

8 Claims, 3 Drawing Sheets

(51) Int. Cl.
*H03K 17/14* (2006.01)
*H02H 3/08* (2006.01)
*H03K 17/16* (2006.01)
*H03K 17/687* (2006.01)
*H03K 17/30* (2006.01)

(52) U.S. Cl.
CPC ......... *H03K 17/145* (2013.01); *H03K 17/161* (2013.01); *H03K 17/687* (2013.01); *H03K 2017/0806* (2013.01); *H03K 2017/307* (2013.01); *H03K 2217/0027* (2013.01)

(58) Field of Classification Search
CPC ..... H03K 2017/307; H03K 2017/0806; H03K 2217/0027; H02H 3/085
USPC ........................................................ 361/93.8
See application file for complete search history.

(56) References Cited

U.S. PATENT DOCUMENTS

| | | | |
|---|---|---|---|
| 2010/0079920 A1* | 4/2010 | Fanic | H03K 17/0822 361/56 |
| 2010/0134941 A1* | 6/2010 | Nakahara | H03K 17/0822 361/91.1 |
| 2010/0321846 A1* | 12/2010 | Fukami | H03K 17/0822 361/91.5 |
| 2011/0001352 A1* | 1/2011 | Tamura | B60L 7/12 307/9.1 |
| 2011/0109372 A1* | 5/2011 | Zanardi | G01K 3/10 327/512 |
| 2014/0072014 A1* | 3/2014 | Tafoya | G01K 1/08 374/178 |
| 2016/0141284 A1* | 5/2016 | Ishihara | H01L 24/49 257/140 |
| 2017/0018918 A1 | 1/2017 | Yano et al. | |

* cited by examiner

SEMICONDUCTOR DEVICE AND CONTROL DEVICE

CROSS-REFERENCE TO RELATED APPLICATIONS

This application is the U.S. national stage of PCT/JP2016/077208 filed on Sep. 15, 2016 which claims priority of Japanese Application No. JP 2015-192122 filed on Sep. 29, 2015.

TECHNICAL FIELD

The present invention relates to a semiconductor device and a control device that control an electric current flowing in a predetermined direction by turning a field effect transistor including a parasitic diode on or off.

BACKGROUND

In a power supply device for a vehicle, there is a risk that a large electric current flows when a starter (a motor) is started, causing an instantaneous high voltage drop. This instantaneous high voltage drop may influence other onboard loads such as an ECU (Electronic Control Unit) and an automotive navigation system. For this reason, recently, to prevent the influence by such a voltage drop, some vehicles employ an auxiliary battery exclusive to a starter. In these vehicles, a MOSFET (Metal Oxide Semiconductor Field Effect Transistor) is used when the starter is started, to separate the starter and the auxiliary battery from other onboard loads.

JP 2013-255425A discloses an ideal diode circuit including a field effect transistor and a comparator that compares a source voltage and a drain voltage of the field effect transistor. In this ideal diode circuit, the field effect transistor is activated based on the comparison result of the comparator.

In the above-described power supply device, it may occur that electrical potentials on the starter side and the auxiliary battery side become higher while the MOSFET is turned off and the starter side and the auxiliary battery side are separated, and therefore an electric current flows through a parasitic diode included in the MOSFET. In this case, because the ON-resistance of the parasitic diode is large, if a large electric current flows through the parasitic diode, high heat is generated. This high heat may burn the MOSFET.

In view of the above-described circumstances, an object of the present invention is to provide a semiconductor device in which a field effect transistor is prevented from burning caused by an electric current flowing through a parasitic diode included in the field effect transistor.

Also, an object of the present invention is to provide a control device that controls a semiconductor device in which a field effect transistor is prevented from burning caused by an electric current flowing through a parasitic diode included in the field effect transistor.

SUMMARY

A semiconductor device according to the present invention includes: a field effect transistor including a parasitic diode; a temperature detector configured to detect a temperature of the parasitic diode; and a controller configured to determine whether the temperature detected by the temperature detector is higher than or equal to a first temperature, and to turn on the field effect transistor if it determines that the detected temperature is higher than or equal to the first temperature.

In this semiconductor device, the field effect transistor includes the parasitic diode, and the temperature detector detects the temperature of the parasitic diode included in the field effect transistor. Also, the controller determines whether the temperature detected by the temperature detector is higher than or equal to the first temperature, and turns on the field effect transistor if it determines that the detected temperature is higher than or equal to the first temperature.

The semiconductor device according to the present invention may be configured such that, if the field effect transistor is off, the controller determines whether the temperature detected by the temperature detector is higher than or equal to the first temperature, and turns on the field effect transistor if it determines that the detected temperature is higher than or equal to the first temperature.

In this semiconductor device, if the field effect transistor is off, the controller determines whether the temperature detected by the temperature detector is higher than or equal to the first temperature. Then, the controller turns on the field effect transistor if it determines that the detected temperature is higher than or equal to the first temperature.

The semiconductor device according to the present invention may be configured such that, after turning on the field effect transistor, the controller determines whether the temperature detected by the temperature detector is lower than or equal to a second temperature that is lower than the first temperature, and turns off the field effect transistor if it determines that the detected temperature is lower than or equal to the second temperature.

In this semiconductor device, after turning on the field effect transistor, the controller determines whether the temperature detected by the temperature detector is lower than or equal to the second temperature that is lower than the first temperature. Then, the controller turns off the field effect transistor if it determines that the detected temperature is lower than or equal to the second temperature.

A control device according to the present invention includes: an acquisition unit configured to acquire a temperature detected by a temperature detector that is configured to detect a temperature of a parasitic diode included in a field effect transistor; a determination unit configured to determine whether the temperature acquired by the acquisition unit is higher than or equal to a first temperature; and a controller configured to turn on the field effect transistor if the determination unit has determined that the acquired temperature is higher than or equal to the first temperature.

In this control device, the acquisition unit acquires the temperature detected by the temperature detector that detects the temperature of the parasitic diode included in the field effect transistor. The determination unit determines whether the temperature acquired by the acquisition unit is higher than or equal to the first temperature, and the controller turns on the field effect transistor if the determination unit has determined that the acquired temperature is higher than or equal to the first temperature.

The control device according to the present invention may be configured such that, if the field effect transistor is off, the determination unit determines whether the temperature acquired by the acquisition unit is higher than or equal to the first temperature, and the controller turns on the field effect transistor if the determination unit has determined that the acquired temperature is higher than or equal to the first temperature.

In this control device, if the field effect transistor is off, the determination unit determines whether the temperature acquired by the acquisition unit is higher than or equal to the first temperature. The controller turns on the field effect transistor if the determination unit has determined that the acquired temperature is higher than or equal to the first temperature.

The control device according to the present invention may be configured such that, after the controller has turned on the field effect transistor, the determination unit determines whether the temperature acquired by the acquisition unit is lower than or equal to a second temperature that is lower than the first temperature, and the controller turns off the field effect transistor if the determination unit has determined that the acquired temperature is lower than or equal to the second temperature.

In this control device, after the controller has turned on the field effect transistor, the determination unit determines whether the temperature acquired by the acquisition unit is lower than or equal to the second temperature that is lower than the first temperature. The controller turns off the field effect transistor if the determination unit has determined that the acquired temperature is lower than or equal to the second temperature.

With the semiconductor device according to the present invention, a semiconductor device in which a field effect transistor is prevented from burning caused by an electric current flowing through a parasitic diode included in the field effect transistor is achieved.

With the control device according to the present invention, a control device that controls a semiconductor device in which a field effect transistor is prevented from burning caused by an electric current flowing through a parasitic diode included in the field effect transistor is achieved.

DETAILED DESCRIPTION OF PREFERRED EMBODIMENTS

The present invention will be described based on drawings illustrating embodiments thereof.

First Embodiment

Figure 1:
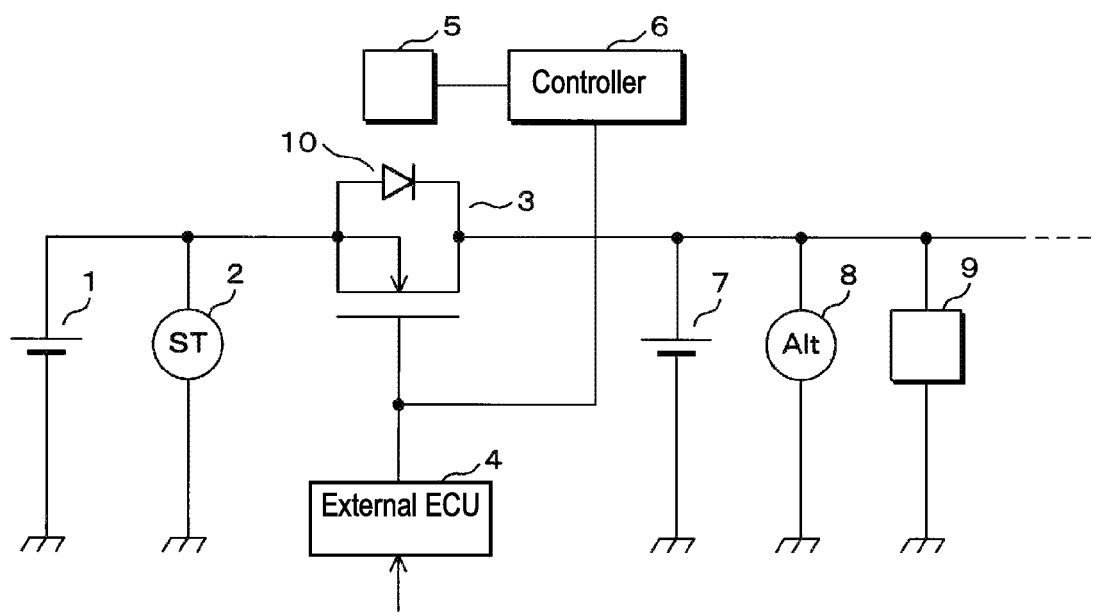
FIG. 1 is a block diagram showing a schematic configuration of an embodiment of a semiconductor device and a control device.

FIG. 1 is a block diagram showing a schematic configuration of a semiconductor device and a control device according to a first embodiment.

This semiconductor device is used in a power supply device in a vehicle, and includes an N-channel MOSFET (Metal Oxide Semiconductor Field Effect Transistor) 3, a temperature detector 5, a controller 6, and an external ECU 4.

The MOSFET 3 includes a parasitic diode 10, and its gate is connected to the external ECU 4 and the controller 6, whereas its drain is connected to the plus terminals of a main battery 7, an alternator (alternating current generator) 8, and onboard loads such as an automotive navigation system 9 in the vehicle.

Also, the source of the MOSFET 3 is connected to the plus terminals of an auxiliary battery 1 and a starter 2 in the vehicle.

The temperature detector 5 detects the temperature of the parasitic diode 10, and provides a detected temperature value T to the controller 6.

The controller (acquisition unit, determination unit) 6 determines whether the temperature value T provided by the temperature detector 5 is higher than or equal to a first temperature value T1, and if the temperature value T is higher than or equal to the first temperature value T1, the controller 6 turns on the MOSFET 3. Also, after turning on the MOSFET 3, the controller 6 determines whether the temperature value T provided by the temperature detector 5 is lower than or equal to a second temperature value T2 (<T1), and if the temperature value T is lower than or equal to the second temperature value T2, the controller 6 turns off the MOSFET 3.

The external ECU 4 is linked with an ignition key (not shown), when it senses that the starter 2 is started, based on a behavior of the ignition key, it turns off the MOSFET 3. Then, after the starter 2 has started, the external ECU 4 turns on the MOSFET 3 again.

Note that the gate of the MOSFET 3 and the output terminals of the external ECU 4 and the controller 6 are wired in an OR connection. Specifically, if one or both of the output terminals of the external ECU 4 and the controller 6 are at H level, the MOSFET 3 turns on, whereas if both of the output terminals of the external ECU 4 and the controller 6 are at L level, the MOSFET 3 turns off.

The plus terminal of the main battery 7 is connected to the drain of the MOSFET 3, whereas its minus terminal is grounded. The main battery 7 stores electric power that the alternator 8 generates.

The plus terminal of the alternator 8 is connected to the drain of the MOSFET 3, whereas its minus terminal is grounded. The alternator 8 generates electric power in cooperation with an engine (not shown), and rectifies and outputs the electric power.

The starter 2 is a starter motor for starting the engine, and its plus terminal is connected to the source of the MOSFET 3, whereas its minus terminal is grounded.

The auxiliary battery 1 is exclusive to the starter 2, and its plus terminal is connected to the source of the MOSFET 3, whereas its minus terminal is grounded.

Figure 2:
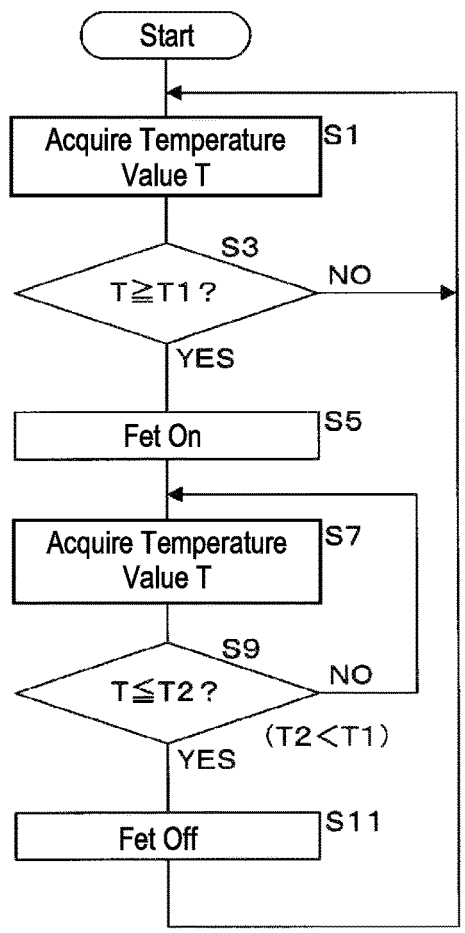
FIG. 2 is a flowchart showing an operation example of the semiconductor device and the control device.

An operation of the semiconductor device and the control device with such a configuration will be described below with reference to the flowchart shown in FIG. 2.

When the external ECU 4 senses that the starter 2 is started, the external ECU 4 turns off the MOSFET 3. In this state, if a voltage on the source side of the MOSFET 3 becomes higher than that on the drain side thereof, an electric current flows through the parasitic diode 10. As a result, the parasitic diode 10 generates heat.

The controller 6 constantly acquires a temperature value T detected by the temperature detector 5 (S1), and determines whether the acquired temperature value T is higher than or equal to the first temperature value T1 (S3).

If the acquired temperature value T is not higher than or equal to the first temperature value T1 (S3), the controller 6 continues to acquire a temperature value T detected by the temperature detector 5 (S1).

If the acquired temperature value T is higher than or equal to the first temperature value T1 (S3), the controller 6 turns on the MOSFET 3 (S5), then continues to acquire a temperature value T detected by the temperature detector 5 (S7).

Next, the controller 6 determines whether the acquired temperature value T (S7) is lower than or equal to the second temperature value T2 that is lower than the first temperature T1 (S9), and if the acquired temperature value T is not lower than or equal to the second temperature value T2, then the controller 6 continues to acquire a temperature value T detected by the temperature detector 5 (S7).

If the acquired temperature value T (S7) is lower than or equal to the second temperature value T2 (S9), the controller 6 turns off the MOSFET 3 (S11), then continues to acquire a temperature value T detected by the temperature detector 5 (S1). At this time, if the engine has already started and the external ECU 4 has turned on the MOSFET 3 again, the MOSFET 3 is kept on regardless of the off operation by the controller 6.

Second Embodiment

Figure 3:
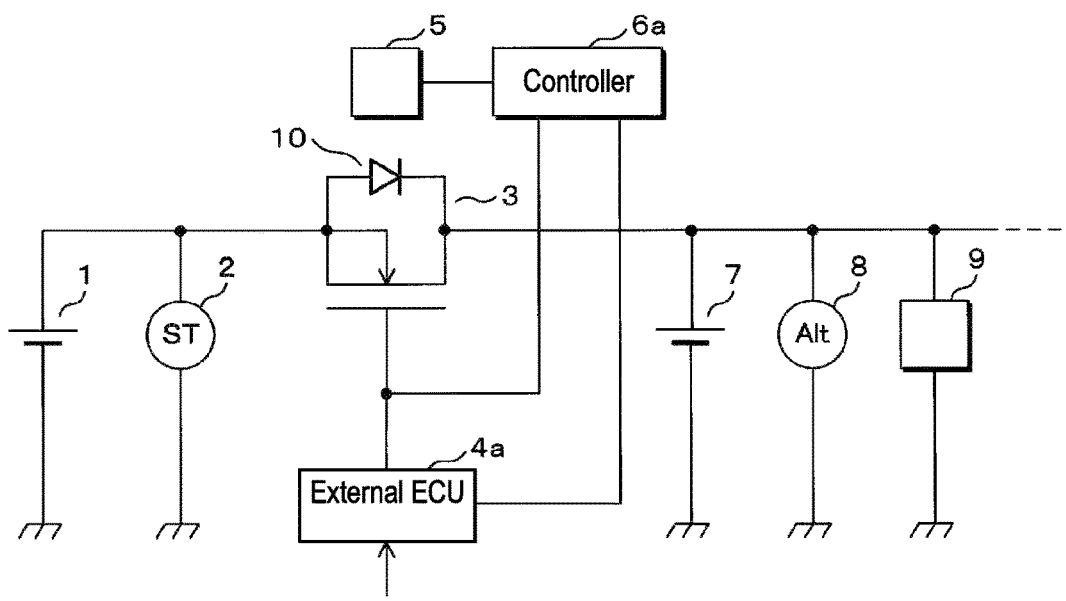
FIG. 3 is a block diagram showing a schematic configuration of an embodiment of a semiconductor device and a control device.

FIG. 3 is a block diagram showing a schematic configuration of a semiconductor device and a control device according to a second embodiment.

This semiconductor device is used in a power supply device in a vehicle, and includes the N-channel MOSFET (Metal Oxide Semiconductor Field Effect Transistor) 3, the temperature detector 5, a controller 6a, and an external ECU 4a.

The controller (acquisition unit, determination unit) 6a is notified by the external ECU 4a whether the MOSFET 3 is on or off. If the MOSFET 3 is off, the controller 6a determines whether a temperature value T provided by the temperature detector 5 is higher than or equal to a first temperature value T1.

If the temperature value T is higher than or equal to the first temperature value T1, the controller 6a turns on the MOSFET 3. After turning on the MOSFET 3, the controller 6a determines whether the temperature value T provided by the temperature detector 5 is lower than or equal to a second temperature value T2 (<T1), and if the temperature value T is lower than or equal to the second temperature value T2, the controller 6a turns off the MOSFET 3.

The external ECU 4a is linked with an ignition key (not shown), and when it senses that the starter 2 is started, based on a behavior of the ignition key, it turns off the MOSFET 3. Then, after the starter 2 has started, the external ECU 4a turns on the MOSFET 3 again. In addition, the external ECU 4a notifies the controller 6a whether the MOSFET 3 is on or off.

Note that the gate of the MOSFET 3 and the output terminals of the external ECU 4a and the controller 6a are wired in an OR connection. Specifically, if one or both of the output terminals of the external ECU 4a and the controller 6a are at H level, the MOSFET 3 turns on, whereas if both of the output terminals of the external ECU 4a and the controller 6a are at L level, the MOSFET 3 turns off. Because other configurations in the semiconductor device and the control device are the same as those of the first embodiment, the explanation of the configurations is omitted.

Figure 4:
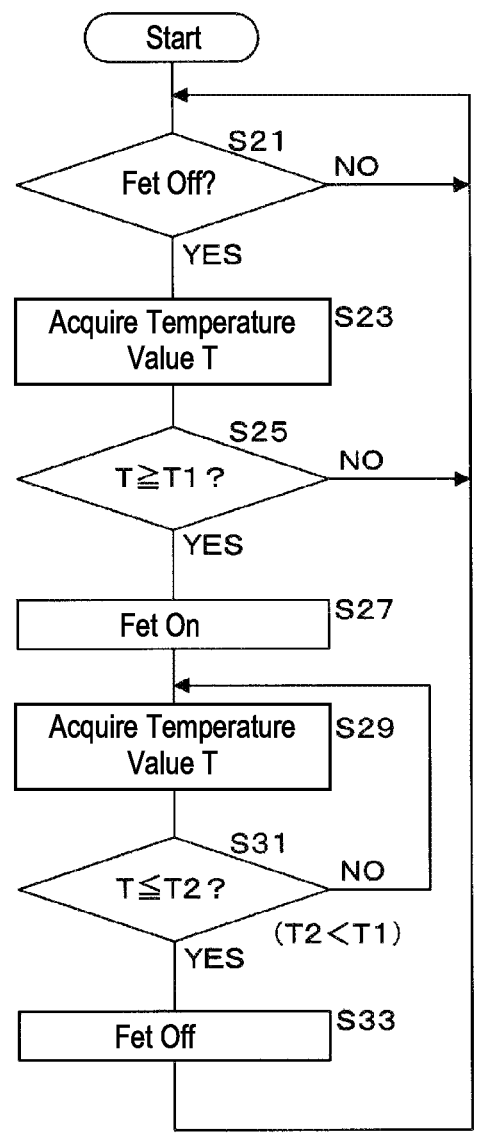
FIG. 4 is a flowchart showing an operation example of the semiconductor device and the control device.

An operation of the semiconductor device and the control device with such a configuration will be described below with reference to the flowchart shown in FIG. 4.

When the external ECU 4a senses that the starter 2 is started, the external ECU 4a turns off the MOSFET 3 and notifies the controller 6a that the MOSFET 3 is off. In this state, if a voltage on the source side of the MOSFET 3 becomes higher than that on the drain side thereof, an electric current flows through the parasitic diode 10. As a result, the parasitic diode 10 generates heat.

The controller 6a constantly determines whether the MOSFET 3 is off (S21), and if the MOSFET 3 is off, then the controller 6a acquires a temperature value T detected by the temperature detector 5 (S23). If the MOSFET 3 is not off, the controller 6a again determines whether the MOSFET 3 is off (S21).

The controller 6a determines whether the acquired temperature value T (S23) is higher than or equal to the first temperature T1 (S25), and if the acquired temperature value T is not higher than or equal to the first temperature T1, then the controller 6a determines whether the MOSFET 3 is off (S21).

If the acquired temperature value T is higher than or equal to the first temperature T1 (S25), the controller 6a turns on the MOSFET 3 (S27), and then continues to acquire a temperature value T detected by the temperature detector 5 (S29).

The controller 6a determines whether the acquired temperature value T (S29) is lower than or equal to the second temperature value T2 that is lower than the first temperature T1 (S31), and if the acquired temperature value T is not lower than or equal to the second temperature value T2, then the controller 6a again acquires a temperature value T detected by the temperature detector 5 (S29).

If the acquired temperature value T (S29) is lower than or equal to the second temperature value T2 (S31), the controller 6a turns off the MOSFET 3 (S33), and then determines whether the MOSFET 3 is off (S21). At this time, if the engine has already started and the external ECU 4a has turned on the MOSFET 3 again, the MOSFET 3 is kept on regardless of the off operation by the controller 6a.

In the first and second embodiments, examples are explained using an N-channel MOSFET as the MOSFET 3. However, the same object can also be achieved using a P-channel MOSFET as the MOSFET 3.

The first and second embodiments disclosed herein are examples in all respects, and are not to be construed as limiting. The scope of the present invention is defined by the claims rather than by the meaning of the description above, and all modifications equivalent to and within the scope of the claims are intended to be encompassed.

INDUSTRIAL APPLICABILITY

The present invention can be utilized in a semiconductor device and a control device used in a power supply device installed in a vehicle.

The invention claimed is:

1. A semiconductor device for use in a power supply system having a battery and a starter connected in parallel, the semiconductor device connected in series with the battery and starter, the semiconductor device comprising:
   a field effect transistor including a parasitic diode, a source terminal, a drain terminal and a gate terminal, the source terminal connected in series to the battery and the starter;
   a temperature detector configured to detect a temperature of the parasitic diode; and
   a controller configured to determine whether the temperature detected by the temperature detector is higher than or equal to a first temperature, and to turn on the field effect transistor if it determines that the detected temperature is higher than or equal to the first temperature wherein an electric current is directed through the drain terminal so as to prevent the parasitic diode from being damaged by heat.

2. The semiconductor device according to claim 1, wherein, if the field effect transistor is off, the controller is configured to determine whether the temperature detected by the temperature detector is higher than or equal to the first temperature, and to turn on the field effect transistor if it determines that the detected temperature is higher than or equal to the first temperature.

3. The semiconductor device according to claim 1, wherein, after turning on the field effect transistor, the controller is configured to determine whether the temperature detected by the temperature detector is lower than or equal to a second temperature that is lower than the first temperature, and to turn off the field effect transistor if it determines that the detected temperature is lower than or equal to the second temperature.

4. A control device for use in a power system having a battery and a starter connected in parallel, the control device comprising:
an acquisition unit configured to acquire a temperature detected by a temperature detector that is configured to detect a temperature of a parasitic diode included in a field effect transistor, the field effect transistor having a drain terminal, a source terminal and a gate terminal, the source terminal connected in series to the battery and the starter;
a determination unit configured to determine whether the temperature acquired by the acquisition unit is higher than or equal to a first temperature; and
a controller configured to turn on the field effect transistor if the determination unit has determined that the acquired temperature is higher than or equal to the first temperature, wherein an electric current is directed through the drain terminal so as to prevent the parasitic diode from being damaged by heat.

5. The control device according to claim 4, wherein, if the field effect transistor is off, the determination unit is configured to determine whether the temperature acquired by the acquisition unit is higher than or equal to the first temperature, and the controller is configured to turn on the field effect transistor if the determination unit has determined that the acquired temperature is higher than or equal to the first temperature.

6. The control device according to claim 4, wherein, after the controller has turned on the field effect transistor, the determination unit is configured to determine whether the temperature acquired by the acquisition unit is lower than or equal to a second temperature that is lower than the first temperature, and the controller is configured to turn off the field effect transistor if the determination unit has determined that the acquired temperature is lower than or equal to the second temperature.

7. The semiconductor device according to claim 2, wherein, after turning on the field effect transistor, the controller is configured to determine whether the temperature detected by the temperature detector is lower than or equal to a second temperature that is lower than the first temperature, and to turn off the field effect transistor if it determines that the detected temperature is lower than or equal to the second temperature.

8. The control device according to claim 5, wherein, after the controller has turned on the field effect transistor, the determination unit is configured to determine whether the temperature acquired by the acquisition unit is lower than or equal to a second temperature that is lower than the first temperature, and the controller is configured to turn off the field effect transistor if the determination unit has determined that the acquired temperature is lower than or equal to the second temperature.

* * * * *